(12) United States Patent
Clark

(10) Patent No.: US 9,680,437 B2
(45) Date of Patent: Jun. 13, 2017

(54) EQUALIZATION CONTOURING BY A CONTROL CURVE

(71) Applicant: Jeffrey Clark, Alhambra, CA (US)

(72) Inventor: Jeffrey Clark, Alhambra, CA (US)

(73) Assignee: AUDYSSEY LABORATORIES, INC., Los Angeles, CA (US)

( * ) Notice: Subject to any disclaimer, the term of this patent is extended or adjusted under 35 U.S.C. 154(b) by 43 days.

(21) Appl. No.: 14/805,118

(22) Filed: Jul. 21, 2015

(65) Prior Publication Data

US 2017/0026016 A1 Jan. 26, 2017

(51) Int. Cl.
H04R 3/04 (2006.01)
H03G 5/00 (2006.01)
H03G 5/16 (2006.01)
H03G 5/02 (2006.01)

(52) U.S. Cl.
CPC ............ *H03G 5/165* (2013.01); *H03G 5/025* (2013.01)

(58) Field of Classification Search
CPC .......... H03G 5/025; H03G 5/165; H04R 3/00; H04R 3/04; H04R 2430/01; H04R 29/001; H04S 7/307
See application file for complete search history.

(56) References Cited

U.S. PATENT DOCUMENTS

| 5,506,910 | A * | 4/1996 | Miller | H03G 3/32 381/103 |
| 7,769,183 | B2 * | 8/2010 | Bharitkar | H04S 7/30 381/103 |
| 8,150,069 | B2 * | 4/2012 | Nakano | H03G 5/165 381/103 |
| 9,467,111 | B2 * | 10/2016 | Turner | H03G 5/025 |
| 2005/0195995 | A1 * | 9/2005 | Baumgarte | H03G 5/165 381/104 |
| 2008/0049948 | A1 * | 2/2008 | Christoph | H04S 7/301 381/86 |
| 2009/0274307 | A1 * | 11/2009 | Yoshino | H04S 7/301 381/1 |
| 2010/0111330 | A1 * | 5/2010 | Baumgarte | H03G 5/165 381/119 |
| 2014/0003627 | A1 | 1/2014 | Turner et al. | |

(Continued)

*Primary Examiner* — Thang Tran
(74) *Attorney, Agent, or Firm* — Kenneth L. Green; Averill & Green

(57) ABSTRACT

A method for equalization contouring provides a reduction of equalization in certain frequency regions either by user control or by automated selection of frequency, without introducing artifacts. A control curve smoothly scales the magnitude of the equalization in the areas where less equalization is desired to obtain a contoured equalization. The control curve varies by frequency and may be defined specifically for every sampled frequency value of the equalization, may be a continuous function of frequency, or may be a function of control points at a select number of frequency points. The control curve may also have automatic inputs, e.g. a machine-detected cutoff frequency of a speaker may be used to determine a control point in the control curve. As another example, the reverberation time (e.g. RT60) may be used to determine a control point in the control curve. The result is a contoured equalization curve without sudden steps.

19 Claims, 8 Drawing Sheets

(56) References Cited

U.S. PATENT DOCUMENTS

2014/0192616 A1* 7/2014 Kishinami ............. G10K 15/02
367/7
2015/0263871 A1* 9/2015 Terada ................... H03G 5/165
375/232

* cited by examiner

EQUALIZATION CONTOURING BY A CONTROL CURVE

BACKGROUND OF THE INVENTION

The present invention relates to signal processing and in particular to signal equalization.

When performing equalization, there are cases where it is undesirable to apply the equalization over the entire frequency spectrum, and it may be desirable to scale the equalization in portions of the frequency spectrum. It is undesirable to suddenly stop the equalization at a given frequency because this is difficult or impossible to implement with reasonable length filters, and filters implementing such sudden steps in either the magnitude or slope of the frequency/magnitude response result in artifacts such as time-domain ringing which causes audible artifacts.

BRIEF SUMMARY OF THE INVENTION

The present invention addresses the above and other needs by providing a method for equalization contouring provides a reduction of equalization in certain frequency regions either by user control or by automated selection of frequency, without introducing artifacts. A control curve smoothly scales the magnitude of the equalization in the areas where less equalization is desired to obtain a contoured equalization. The control curve varies by frequency and may be defined specifically for every sampled frequency value of the equalization, may be a continuous function of frequency, or may be a function of control points at a select number of frequency points. The control curve may also have automatic inputs, e.g. a machine-detected cutoff frequency of a speaker may be used to determine a control point in the control curve. As another example, the reverberation time (e.g. RT60) may be used to determine a control point in the control curve. The result is a contoured equalization curve without sudden steps.

In accordance with one aspect of the invention, there is provided a method for designing a control curve for equalization contouring using Bezier interpolation. Equalization start and end frequencies, and a full (or uncontoured) start and end frequencies are specified, and Bezier interpolation is applied to determine a corresponding control curve.

In accordance with one aspect of the invention, there is provided a method for designing a control curve for equalization contouring using linear interpolation. Equalization start and end frequencies, and a full (or uncontoured) start and end frequencies are specified, and linear interpolation is applied to determine a corresponding control curve.

In accordance with one aspect of the invention, there is provided a method for designing a control curve for equalization contouring using spline interpolation. Equalization start and end frequencies, and control curve values at two intermediate frequencies are specified, and spline interpolation is applied to determine a corresponding control curve.

In accordance with one aspect of the invention, there is provided a method for designing a control curve for exaggerated equalization contouring using interpolation. Control curve values at beginning and end frequencies, and at least one intermediate frequency (the magnitude of at least one frequency greater than unity) are specified, and interpolation is applied to determine a corresponding control curve. The interpolation may be spline interpolation, or some other interpolation.

In accordance with one aspect of the invention, there is provided a method for automatically designing a control curve for equalization contouring. For example, a machine-detected cutoff frequency of a speaker may be used to determine a control point in the control curve. In another example, the reverberation time (e.g. RT60, the time it takes for a signal to drop by 60 dB) may be used to determine a control point of the control curve.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
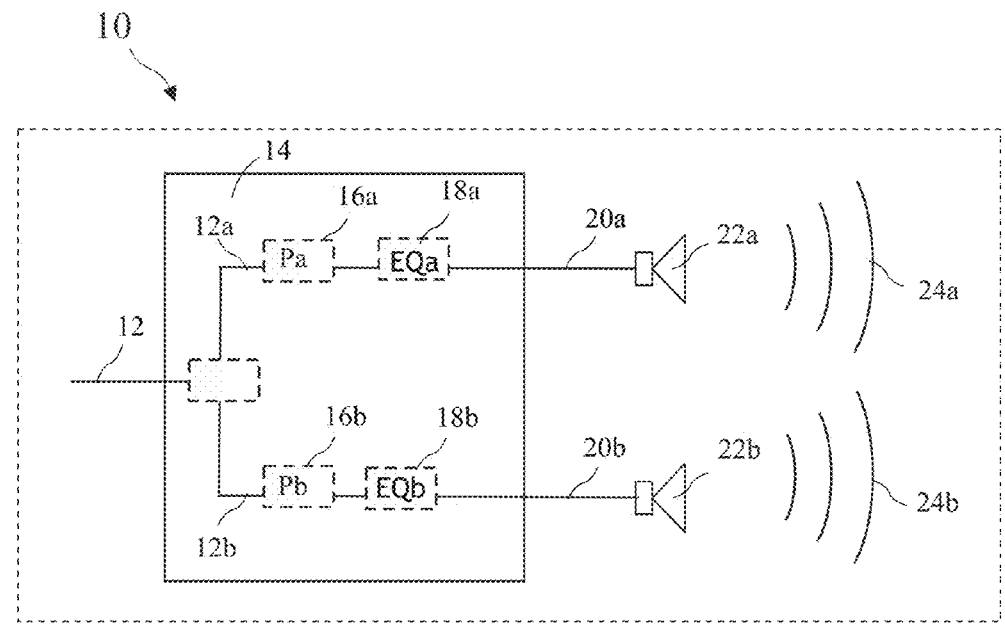
FIG. 1 depicts a prior art audio system with equalization filters.

An example system level description of a prior art two-channel 12a and 12b audio system 10, with equalization filters 18a and 18b in the channels 12a and 12b for modifying and/or correcting loudspeaker-room acoustics, is shown in FIG. 1. The equalization filters 18a and 18b are in series with signal processing 16a and 16b respectively. The system 10 receives a signal 12 including the two channels 12a and 12b processed in parallel. The equalization filters 18a and 18b process the channels 12a and 12b to provide equalized signals 20a and 20b provided to speakers 22a and 22b. The equalization filters 18a and 18b are designed to process the channels 12a and 12b to provide special sound effect such as a hall sound, an open stage sound, and other sound effect, and/or to overcome poor sound environments to provide accurate sound reproduction signals 24a and 24b. However, different listeners have different subjective preferences with respect to bass and treble content of the sound reproduction signals 24a and 24b.

The equalization curves may be selected from a menu provided by an audio receiver. Equalization curves to overcome poor sound environments may be established by functions built into audio receivers. Such functions are described in U.S. Pat. No. 7,769,183, which patent is herein incorporated on its entirely by reference.

Figure 2:
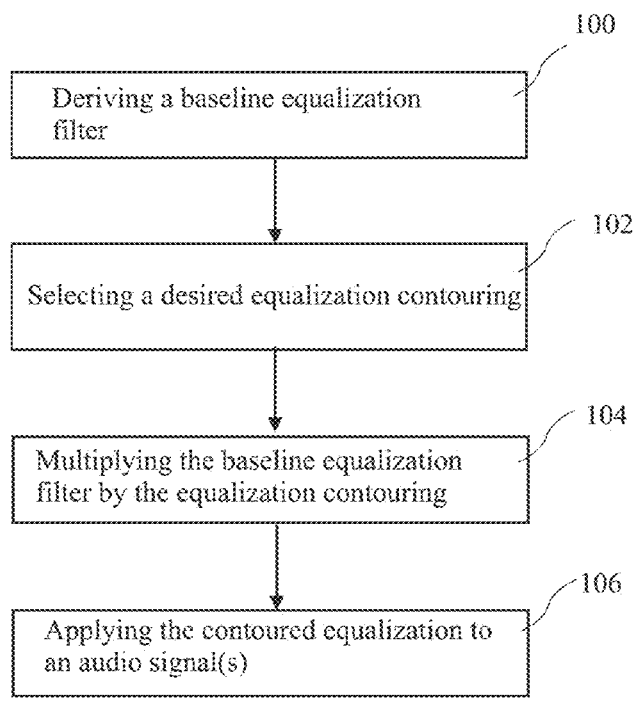
FIG. 2 is a method according to the present invention.

FIG. 2 is a method for contouring the equalization curve 32 (see FIG. 3) according to the present invention. The method includes deriving a baseline equalization at step 100, selecting a desired equalization contouring (a control curve) at step 102, multiplying the baseline equalization filter by the equalization contouring at step 104, and applying the contoured equalization to an audio signal(s) at step 106. Deriving a baseline equalization may comprise selecting a stored equalization in an audio receiver or signal processor, or room equalization (e.g., exercising a room equalization process in the audio receiver or signal processor to provide equalization to compensate for speaker or room characteristics), or be a combination of a stored equalization and room equalization. When the baseline equalization is represented as values at a set of frequencies, the control curve may be evaluated at the set of frequencies and corresponding values of the baseline equalization multiplied times the control curve values, and stored as a contoured equalization.

Figure 3:
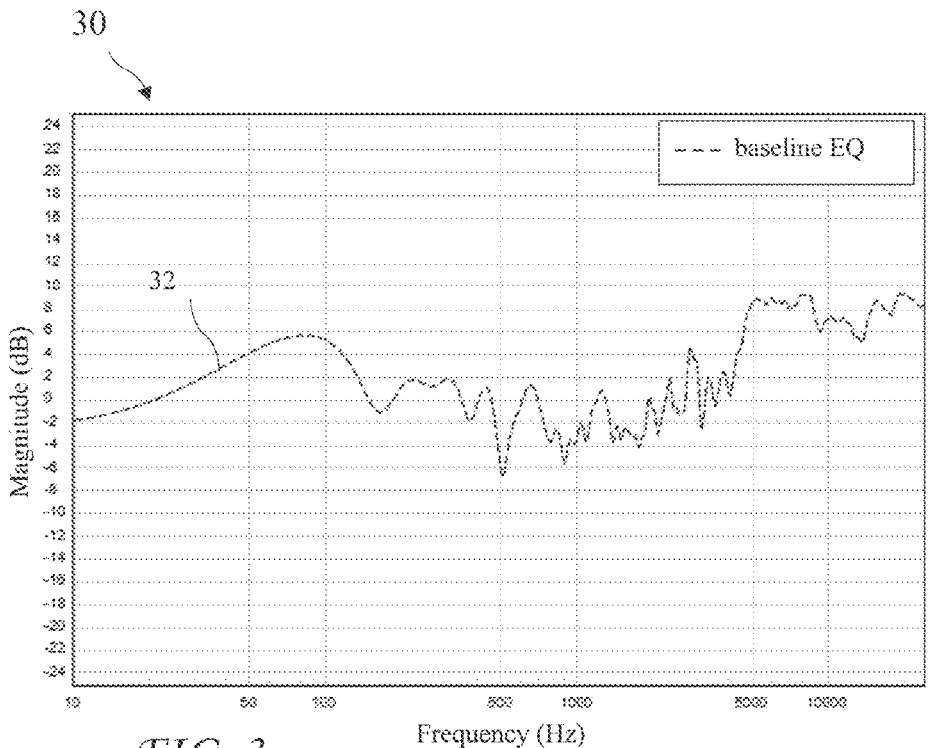
FIG. 3 shows a baseline equalization curve.

A plot 30 of a baseline equalization curve 32 is shown in FIG. 3. The baseline equalization curve 32 is shown from 10 Hz to over 10,000 Hz. 0 dB corresponds to unity gain and 10 dB corresponds to 10 dB. The equalization curve 32 may be represented as a continuous function of frequency or be defined at discrete frequency values.

Figure 4:
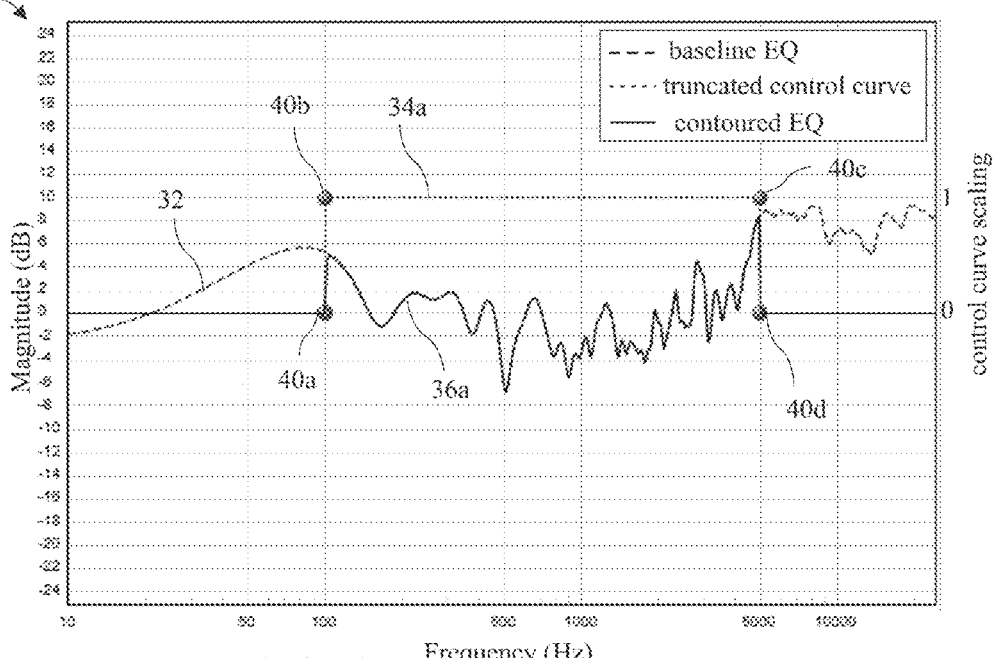
FIG. 4 shows the baseline equalization curve, truncated according to the present invention to obtain a truncated equalization curve.

FIG. 4 shows the baseline equalization curve 32 and a truncated control curve 34a. The truncated control curve 34a is determined by control points 40a-40d and is multiplied times the baseline equalization curve 32 to obtain a truncated equalization curve 36a. The control curve 34a is normalized such that 10 on the decibels scale represents unity scaling of the baseline equalization, while 0 (zero) on the decibels scale represents elimination of equalization (scaling baseline equalization by zero). It is difficult to truncate the baseline equalization at a given frequency because this is difficult or impossible to implement with reasonable length filters, and filters implementing such sudden steps in either the magnitude or slope of the frequency/magnitude response result in artifacts such as time-domain ringing which causes audible artifacts.

Figure 5:
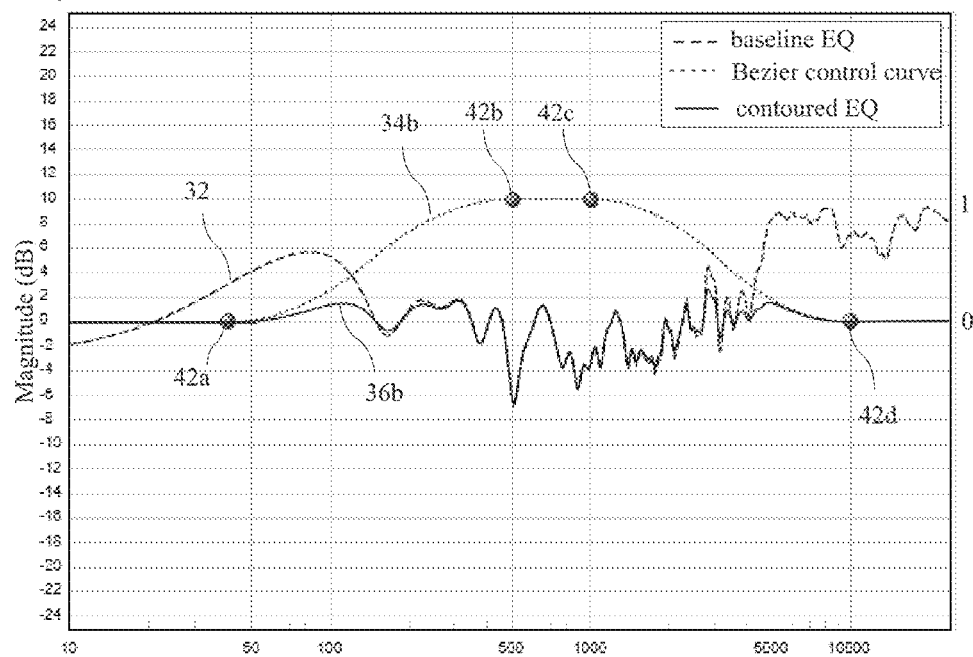
FIG. 5 shows the baseline equalization curve, contoured using a control curve constructed using Bezier interpolation according to the present invention to obtain a contoured equalization curve.

FIG. 5 shows the baseline equalization curve 32 contoured using a control curve 34b constructed using Bezier interpolation through control points 42a-42d to obtain a contoured equalization curve 36b. The control curve 34b eliminates equalization below 40 Hz and above 10 kHz. The control curve 34b preserves the full baseline equalization 32 between 500 and 1 kHz. The transition from no equalization at 40 Hz to full equalization at 500 Hz is smooth, and the transition from full equalization at 1000 Hz to no equalization at 10 kHz is smooth.

Figure 6:
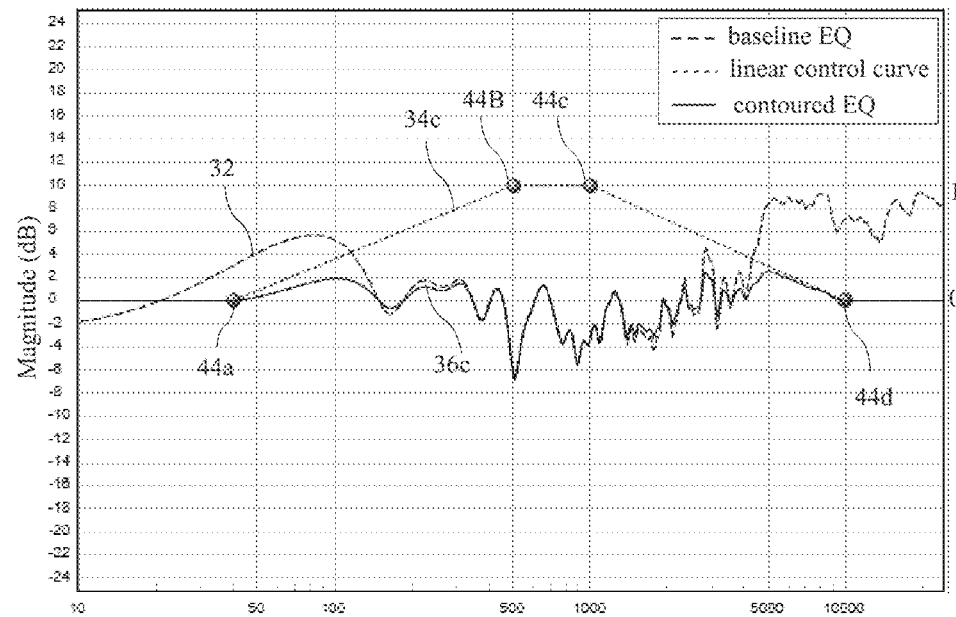
FIG. 6 shows the baseline equalization curve, contoured using a control curve constructed using linear interpolation according to the present invention to obtain a contoured equalization curve.

FIG. 6 shows the baseline equalization curve 32 contoured using a control curve 34c constructed using linear interpolation through control points 44a-44d to obtain a contoured equalization curve 36c. The contoured equalization curve 36c is not a smooth curve, but the truncations of FIG. 4 have been eliminated.

Figure 7:
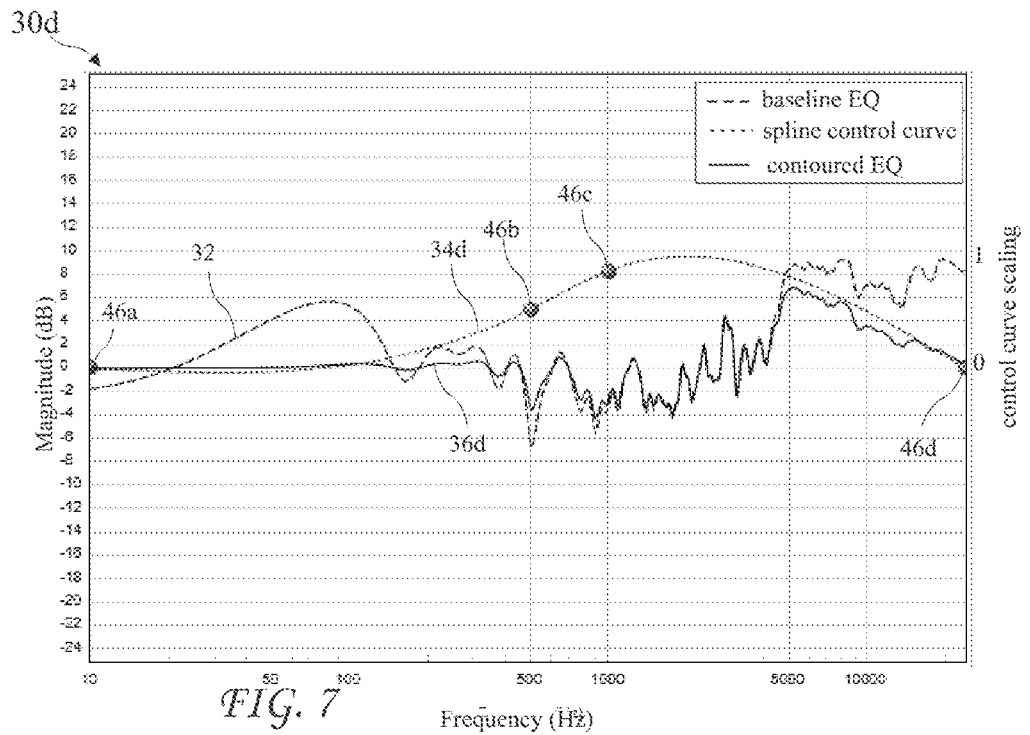
FIG. 7 shows the baseline equalization curve, contoured using a control curve constructed using spline interpolation according to the present invention to obtain a contoured equalization curve.

FIG. 7 shows the baseline equalization curve 32 contoured using a control curve 34d constructed using spline interpolation through control points 46a-46d to obtain a contoured equalization curve 36d.

Figure 8:
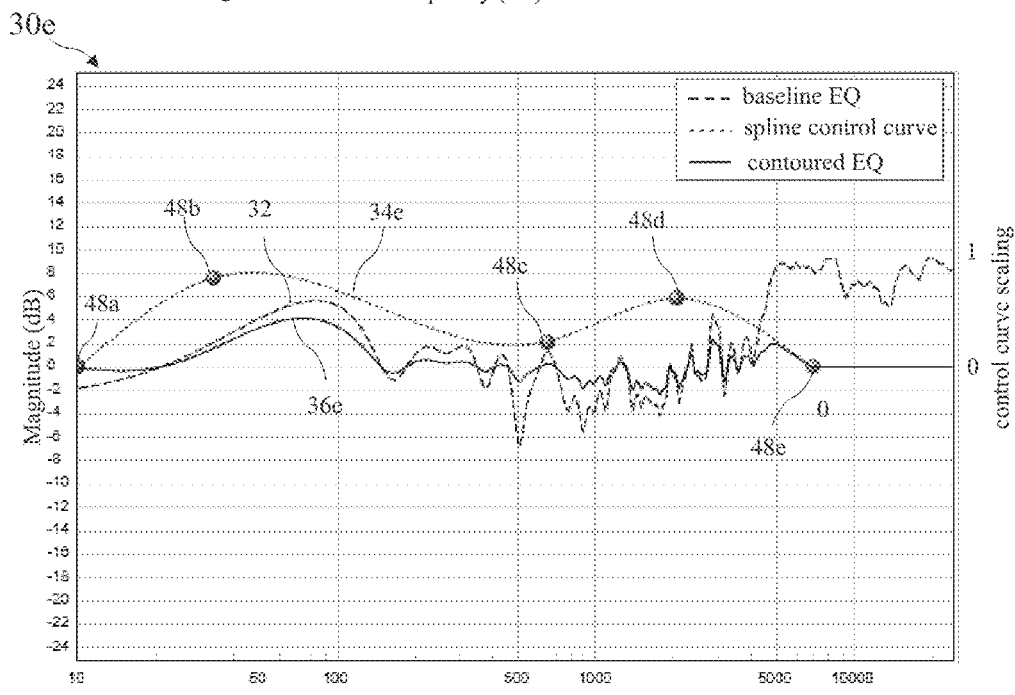
FIG. 8 shows the baseline equalization curve, contoured using a general control curve constructed using spline interpolation according to the present invention to obtain a general contoured equalization curve.

FIG. 8 shows the baseline equalization curve 32 contoured using a control curve 34e constructed using spline interpolation through control points 48a-48e to obtain a contoured equalization curve 36e. The spline interpolation is applied to five points 48a-48e providing a general control curve.

Figure 9:
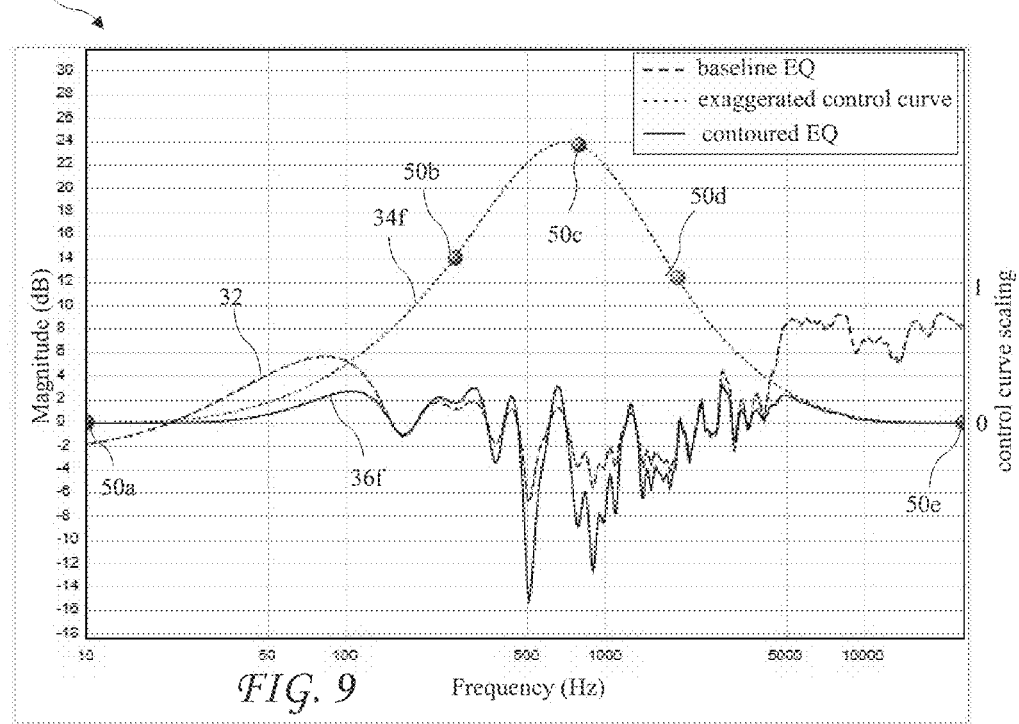
FIG. 9 shows the baseline equalization curve, contoured using an exaggerated control curve constructed using interpolation according to the present invention to obtain an exaggerated, contoured equalization curve.

FIG. 9 shows the baseline equalization curve contoured using an exaggerated control curve 34f constructed using spline interpolation through control points 50a-50e according to the present invention to obtain an exaggerated contoured equalization curve 36f.

Figure 10:
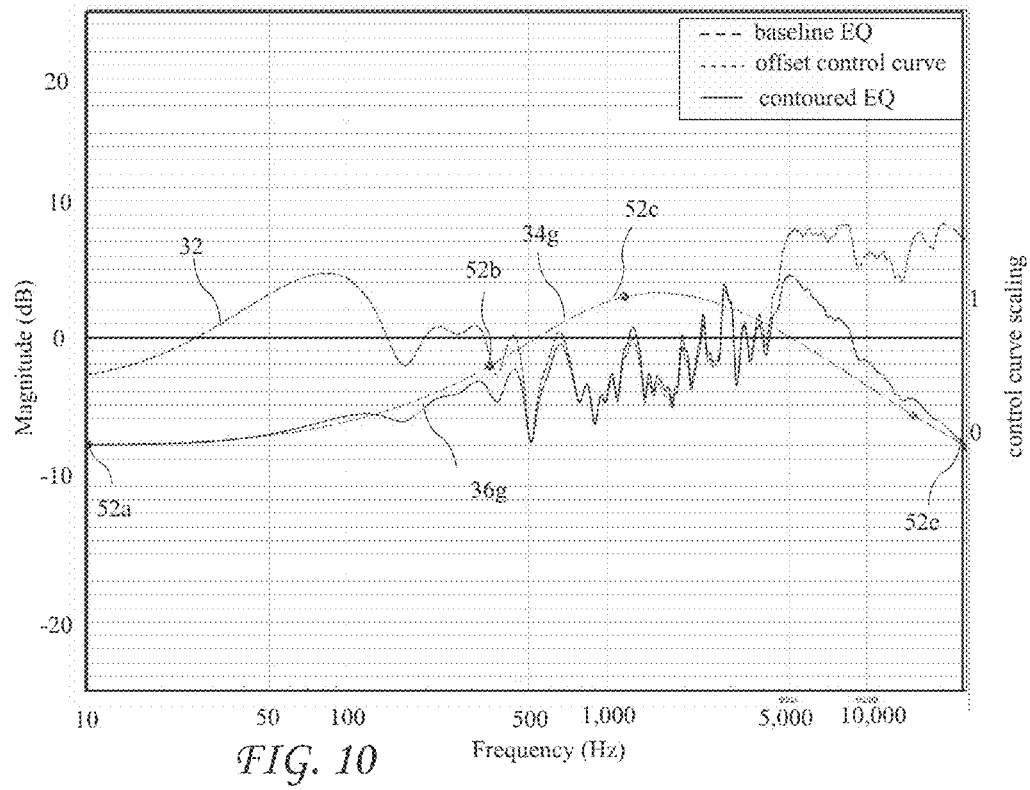
FIG. 10 shows the baseline equalization curve, contoured using a shifted control curve constructed using interpolation according to the present invention to obtain an shifted, contoured equalization curve.

FIG. 10 shows the baseline equalization curve contoured using a shifted control curve 34g constructed using spline interpolation through control points 52a-52e according to the present invention to obtain a shifted contoured equalization curve 36g.

Other examples methods of constructing a control curve are to take function, such as an exponential function of the contouring curve, e.g., square root (expressed as Contour(f)^(½)), square (expressed as Contour(f)^2), or a power of the user's choosing. The control curve itself may be a direct function of frequency, or a function of any number control points at various frequencies. For example, contouring may further be applied to response with either a log or linear magnitude scale, contouring may be applied to a response with either log or linear frequency scale, and contouring may be applied to a frequency-magnitude (see FIG. 3) or complex frequency response (e.g. FFT). Those skilled in the art will recognize that any interface which implements a control curve, modified by a function, and applied to an baseline equalization curve is meant to fall within the scope of this invention.

Expressing the equalization contouring in equations, where "EQ(f)" represents the linear magnitude of the baseline equalization at a set of frequencies (an example of this is the magnitude of an FFT of a time-domain filter impulse response), and "C(f)" represents a scalar control curve, the resulting contoured EQ "CEQ" linear magnitude curve is:

$$CEQ(f)=EQ(f)^{\wedge}C(f)$$

and in mathematically identical form:

$$CEQ(f)=10^{\wedge}(20*\log 10(EQ(f))*C(f)/20)$$

and because the equation includes decibels and inverse decibels, and the "20"s cancel:

$$CEQ(f)=10^{\wedge}(\text{Log }10(EQ(f))*C(f))$$

And, the base is arbitrary, the result may be expressed as:

$$CEQ(f)=e^{\wedge}(\text{Ln}(EQ(f))*C(f))$$

When shifted contouring is applied, the result is shifted by a scalar S and:

$$CEQ(f)=[(S*EQ(f))^{\wedge}C(f)]/S$$

Figure 11:
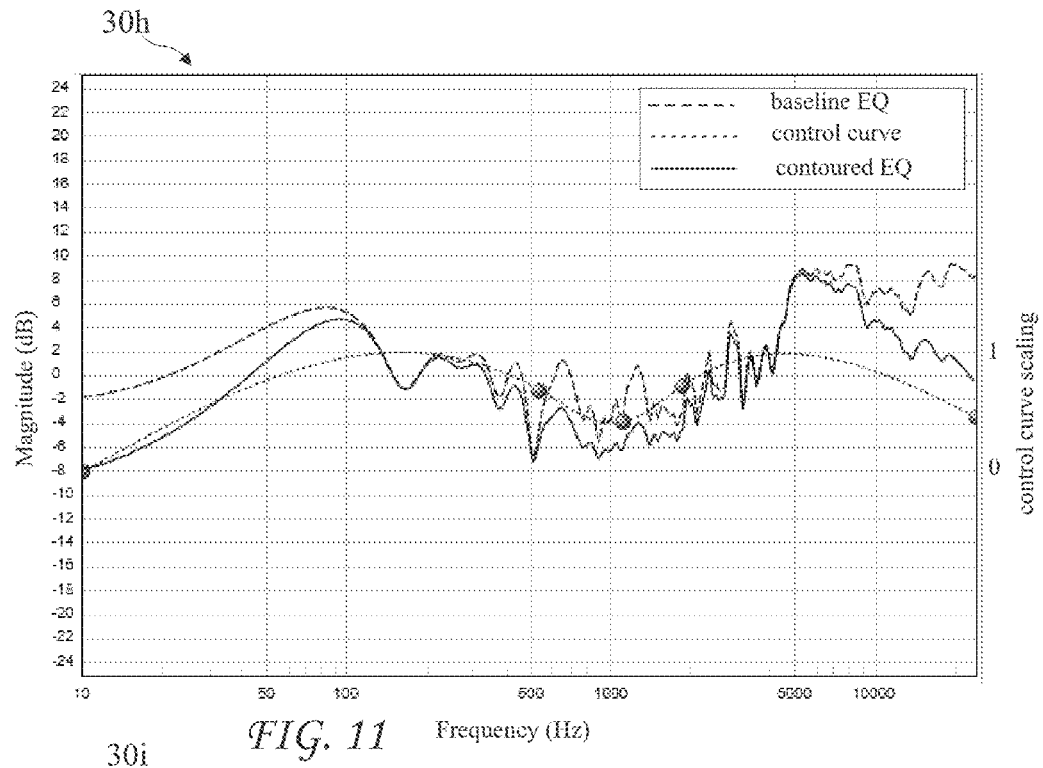
FIGS. 11-15 show additional results of contouring.
Figure 12:
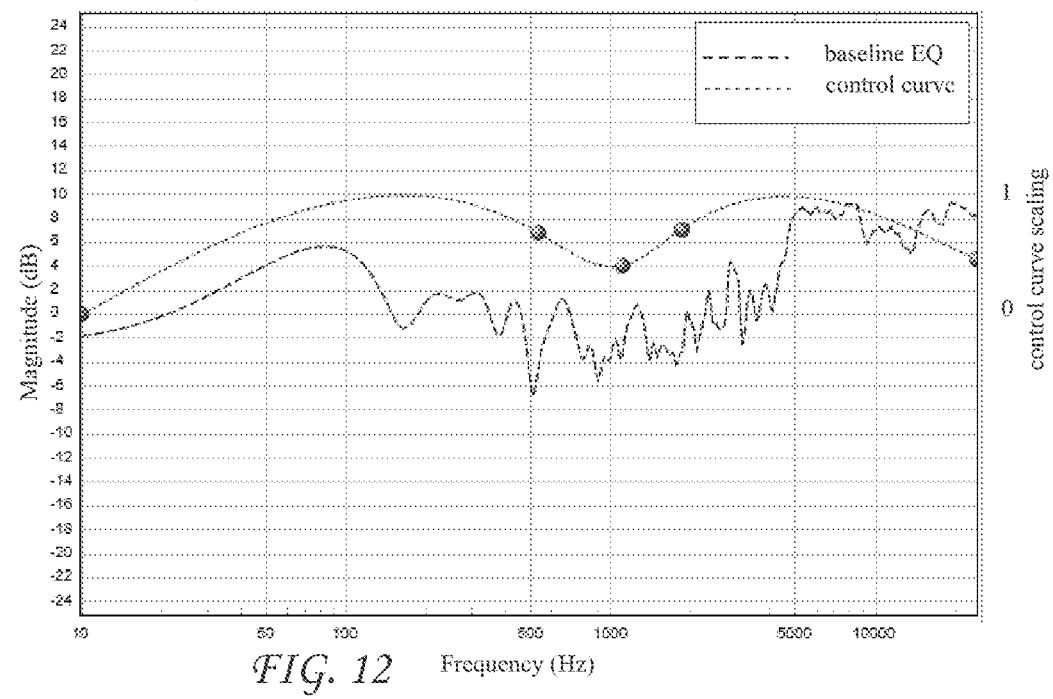
Figure 13:
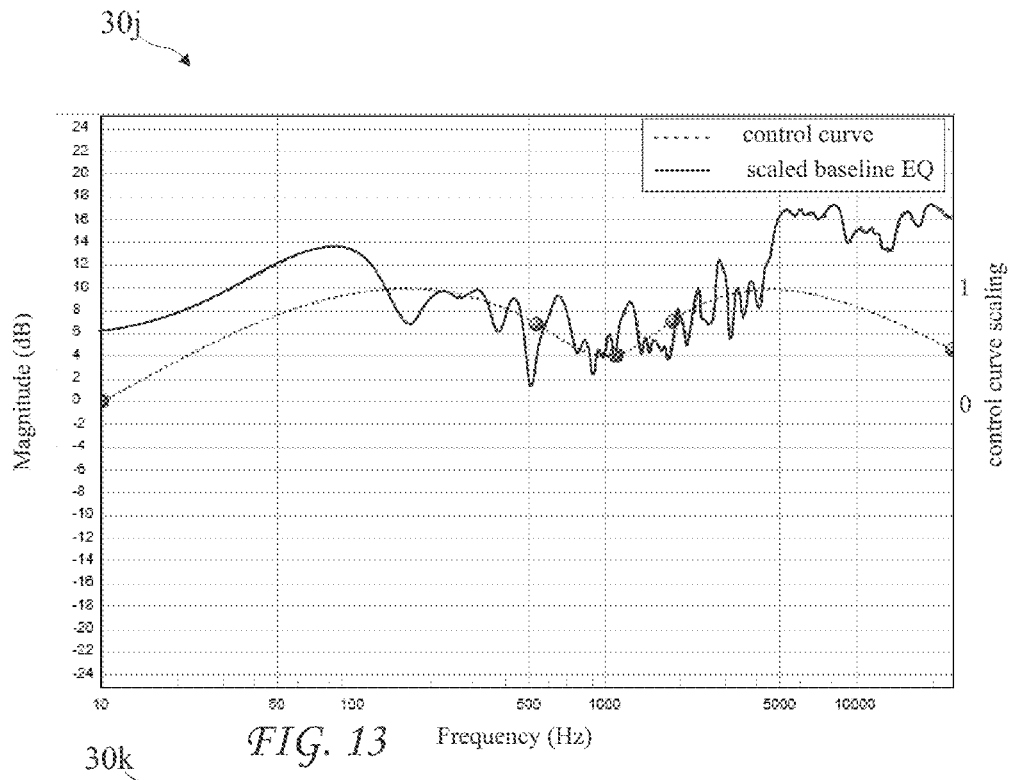
Figure 14:
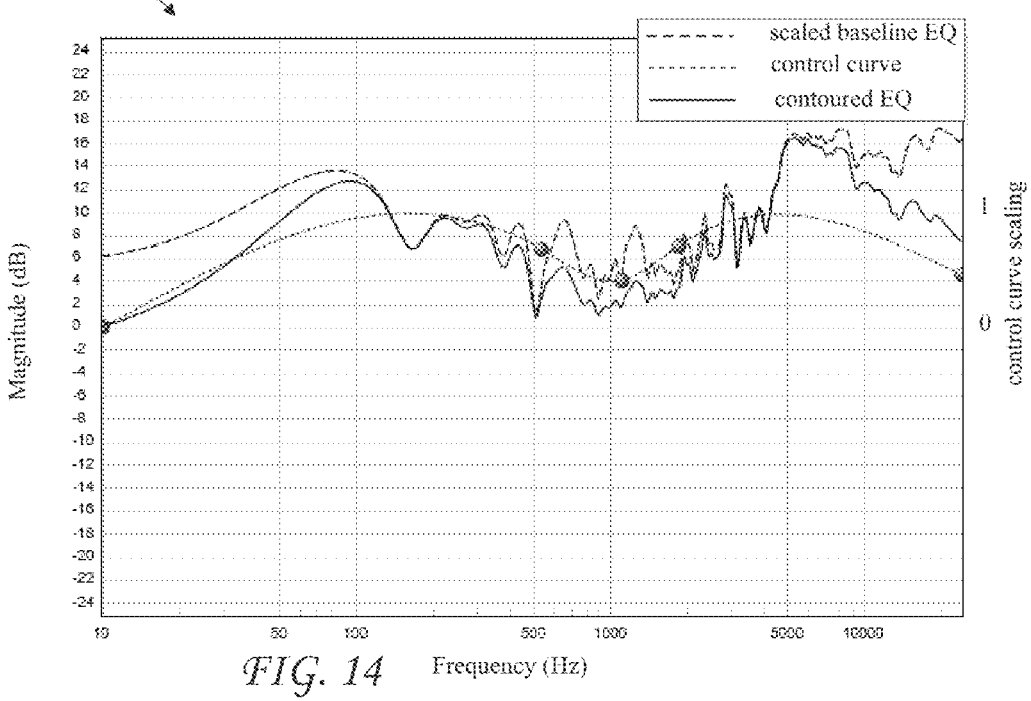
Figure 15:
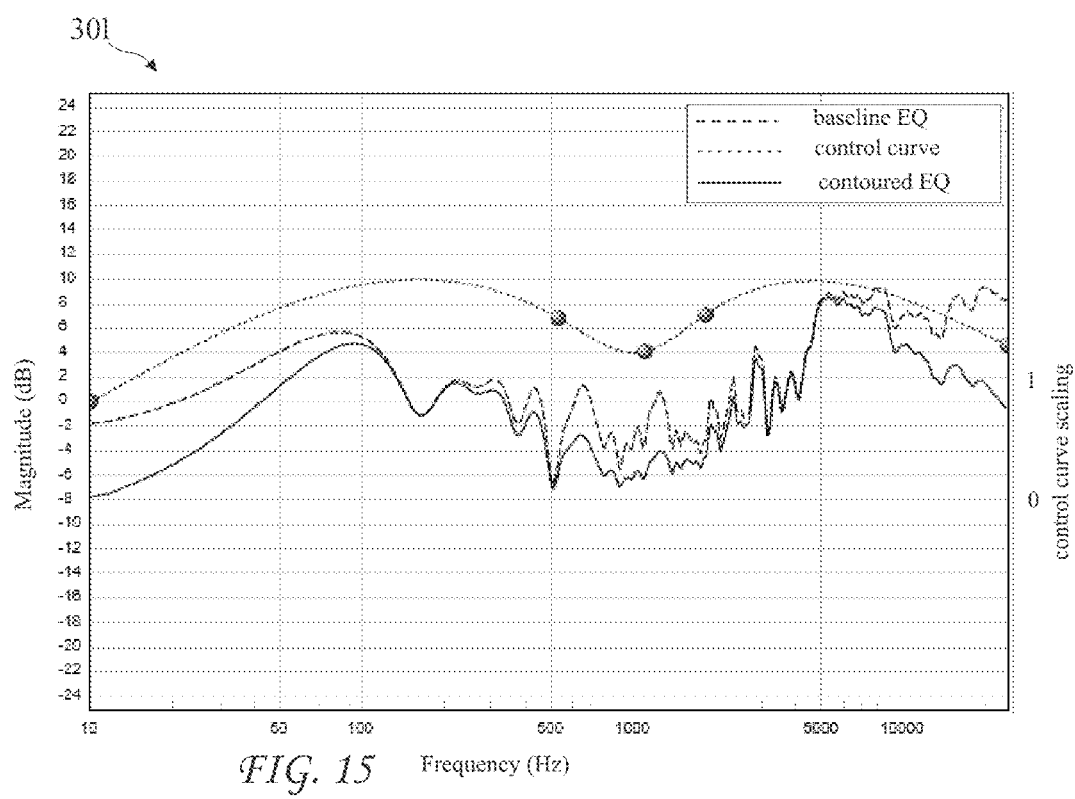

Additional examples plots in FIGS. 11-15 further describe the invention. FIG. 11 shows a clearer contour curve on a −8 dB to +2 dB scale where, for the control curve at −8 dB=0, and at +2 dB=1 (unity). FIG. 12 shows the baseline EQ on a decibels scale as well as the contour curve plotted from 0 dB=0 and 10 dB=1 (unity). FIGS. 13-15 illustrate a clearer example of the equation:

$$CEQ(f)=[(S*EQ(f))\char94 C(f)]/S$$

FIG. 13 shows the baseline EQ scaled up by 8 dB expressed as:

$$S*EQ(f).$$

FIG. 14 shows the control curve applied using the equation:

$$CEQ(f)=(S*EQ(f))\char94 C(f)$$

And finally, FIG. 15 shows the contoured EQ scaled back down (divided by S):

$$CEQ(f)=[(S*EQ(f))\char94 C(f)]/S$$

providing the same result as the original plot.

The control points may be selected in various ways. Most commonly, a user may select a highest frequency FH where they want equalization applied. An algorithm them determines control points based on FH. For example, one control point is determined OL octaves below FH set to unity (1.0 or full equalization) and another control point set to 0 (no equalization) OH octave above FH. The values OL and OH may be, for example, ⅔ and ⅓ Octave.

Control points may also be established based on the effective range of the speaker 22a or 22b transducing the equalized signal. If the effective range is known, a first control point may be set at or just below the lowest effective frequency FL, for example, between FL-100 Hz and FL, and the highest control point may be set at or just above the highest effective frequency FH, for example, between FH and FH+100 Hz. One or more intermediate control point may be set to unity one octave above FL and another control point to one octave below FH.

Another method for selecting control points is based on reverberation time (RT60). The reverberation time may be used to estimate the frequency FR below which the room dominates the response, while above that frequency the speaker dominates the response. It may be desirable in some instances (or for some users) that equalization is applied up to a frequency where room acoustics dominate the response, and cancel the equalization above that frequency so that the speakers may perform as designed. For example, control points may be set to 1 (full equalization) about ½ octave below FR, and another point at 0 (no EQ) about ½ octave above FR.

While the invention herein disclosed has been described by means of specific embodiments and applications thereof, numerous modifications and variations could be made thereto by those skilled in the art without departing from the scope of the invention set forth in the claims.

I claim:

1. A method for equalization contouring in an audio system comprising:
   obtaining a baseline equalization curve stored in a signal processor of the audio system, the baseline equalization curve having a frequency range;
   obtaining a control curve defined over the frequency range of the baseline equalization curve;
   scaling the baseline equalization curve by the control curve in the signal processor to obtain a contoured equalization;
   applying the contoured equalization to an input signal to provide an equalized signal; and
   providing the equalized signal to a transducer of the audio system to produce a physical output.

2. The method of claim 1, wherein the baseline equalization is the magnitude of a result of performing a Fast Fourier Transform (FFT) on a time response of an equalization filter.

3. The method of claim 1, wherein the baseline equalization is a magnitude, in decibels, of a frequency response of an equalization filter.

4. The method of claim 1, wherein the control curve is obtained from an interpolation method comprising interpolation between control points defined in a magnitude-frequency mapping.

5. The method of claim 4, wherein the interpolation method used is linear.

6. The method of claim 4, wherein the interpolation method used is Bezier interpolation.

7. The method of claim 4, wherein the interpolation method used is spline interpolation.

8. The method of claim 4 wherein the control points include a highest frequency control point at a highest frequency for which the baseline equalization is defined and a lowest frequency control point at a lowest frequency for which the baseline equalization is defined.

9. The method of claim 4, wherein a lowest frequency control point is below a lowest frequency for which the baseline equalization is defined or a highest frequency control point is above a highest frequency for which the baseline equalization is defined.

10. The method of claim 9, wherein the contour curve is zero above the highest frequency control point and is zero below the lowest frequency control point.

11. The method of claim 4, wherein;
    the transducer is at least one audio speaker;
    a selected frequency is selectable by a user; and
    the control points provide non-zero equalization at frequencies below the selected frequency and zero equalization at the frequencies above the selected frequency.

12. The method of claim 4, wherein the control points are selected to have a zero magnitude below a lowest frequency of an effective range of the transducer and to have the zero magnitude above a highest frequency of the effective range of the transducer.

13. The method of claim 4, wherein:
    the control points are selected using a reverberation time RT60 to estimate a frequency FR below which the room dominates the response; and
    the control points have a magnitude of one at frequencies below the frequency FR and the control points have a magnitude of zero at frequencies above the frequency FR.

14. The method of claim 1, wherein the baseline equalization curve is a mathematical function of frequency.

15. The method of claim 1, wherein the control curve is a mathematical function of frequency.

16. The method of claim 1, wherein the baseline equalization curve corresponds to a room equalization filter.

17. The method of claim 1, wherein the baseline equalization is derived from an equalization filter stored in a signal processor.

18. A method for equalization contouring in an audio system comprising:
    obtaining a baseline equalization curve stored in a signal processor of the audio system, the baseline equalization curve having a frequency range;
    obtaining a control curve defined over the frequency range of the baseline equalization curve;
    scaling the baseline equalization curve by the control curve in the signal processor to obtain a contoured equalization;

applying the contoured equalization to an input signal to provide an equalized signal; and providing the equalized signal to an audio transducer of the audio system to produce a sound reproduction signal.

19. A method for equalization contouring in an audio system comprising:

obtaining a baseline equalization curve stored in a signal processor of the audio system, the baseline equalization curve represented as a set of values and a set of corresponding frequencies;

obtaining a set of control curve values defined for the set of corresponding frequencies;

raising each value of the baseline equalization curve to a power derived from a corresponding one of the set of control curve values in the signal processor to obtain a contoured equalization;

applying the contoured equalization to an input signal to provide an equalized signal; and providing the equalized signal to an audio transducer of the audio system to produce a sound reproduction signal.

\* \* \* \* \*